US008824203B2

(12) United States Patent
Moschiano et al.

(10) Patent No.: US 8,824,203 B2
(45) Date of Patent: Sep. 2, 2014

(54) MULTIPLE STEP PROGRAMMING IN A MEMORY DEVICE

(75) Inventors: Violante Moschiano, Bacoli (IT); Mason Jones, Seaford, VA (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 13/548,342

(22) Filed: Jul. 13, 2012

(65) Prior Publication Data

US 2014/0016409 A1    Jan. 16, 2014

(51) Int. Cl.
*G11C 11/34* (2006.01)
*G11C 11/56* (2006.01)
*G11C 16/10* (2006.01)
*G11C 16/04* (2006.01)

(52) U.S. Cl.
CPC ........ *G11C 11/5628* (2013.01); *G11C 11/5642* (2013.01); *G11C 16/10* (2013.01); *G11C 16/0483* (2013.01)
USPC ............ 365/185.02; 365/185.03; 365/185.09; 365/185.18; 365/185.24

(58) Field of Classification Search
CPC ........... G11C 11/5628; G11C 11/5642; G11C 16/10; G11C 16/0483
USPC ............. 365/185.02, 185.03, 185.09, 185.18, 365/185.24
See application file for complete search history.

(56) References Cited

U.S. PATENT DOCUMENTS

| | | | | |
|---|---|---|---|---|
| 6,522,580 | B2 * | 2/2003 | Chen et al. | 365/185.02 |
| 7,120,051 | B2 * | 10/2006 | Gorobets et al. | 365/185.02 |
| 7,561,467 | B2 * | 7/2009 | Kang et al. | 365/185.12 |
| 7,843,732 | B2 * | 11/2010 | Lee et al. | 365/185.09 |
| 7,877,564 | B2 | 1/2011 | Eldredge et al. | |
| 7,920,420 | B2 * | 4/2011 | Lee | 365/185.03 |
| 7,952,922 | B2 * | 5/2011 | Aritome | 365/185.02 |
| 8,001,441 | B2 | 8/2011 | Brandman | |
| 8,072,804 | B2 * | 12/2011 | Lee et al. | 365/185.03 |
| 8,122,295 | B2 * | 2/2012 | Kim et al. | 714/42 |
| 8,174,905 | B2 * | 5/2012 | Shalvi et al. | 365/185.29 |
| 8,305,812 | B2 * | 11/2012 | Levy et al. | 365/185.19 |
| 8,335,707 | B2 * | 12/2012 | Petrossi | 705/7.29 |
| 8,369,147 | B2 * | 2/2013 | Aritome | 365/185.12 |
| 8,462,549 | B2 * | 6/2013 | Haratsch et al. | 365/185.03 |
| 8,467,249 | B2 * | 6/2013 | Katz et al. | 365/185.18 |
| 8,526,230 | B2 * | 9/2013 | Haratsch et al. | 365/185.02 |
| 2009/0106626 | A1 | 4/2009 | Hou et al. | |
| 2011/0041040 | A1 | 2/2011 | Su et al. | |

OTHER PUBLICATIONS

Yang et al., "Product Code Schemes for Error Correction in MLC NAND Flash Memories," IEEE Transactions on Very Large Scale (VLSI) Systems, vol. PP, Issue 99, pp. 1-13, Dec. 29, 2011.

* cited by examiner

*Primary Examiner* — Viet Q Nguyen
(74) *Attorney, Agent, or Firm* — Dicke, Billig & Czaja, PLLC

(57) ABSTRACT

A method for multiple step programming programs data to an even page of memory cells. The even page of memory cells is read into a page buffer and the uncertain data is removed. An odd page of memory cells is programmed and the data from the even page data from the page buffer is reprogrammed to the even page of memory cells without the uncertain data.

20 Claims, 5 Drawing Sheets

MULTIPLE STEP PROGRAMMING IN A MEMORY DEVICE

TECHNICAL FIELD

The present embodiments relate generally to memory and a particular embodiment relates to multiple step programming in a memory device.

BACKGROUND

Memory is typically provided as an integrated circuit(s) formed in and/or on semiconductor die(s), whether alone or in combination with another integrated circuit(s), and is commonly found in computers or other electronic devices. There are many different types of memory including random-access memory (RAM), read only memory (ROM), dynamic random access memory (DRAM), synchronous dynamic random access memory (SDRAM), and flash memory.

Flash memories have developed into a popular source of non-volatile memory for a wide range of electronic applications. Flash memories typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, digital cameras, digital media players, digital recorders, games, appliances, vehicles, wireless devices, cellular telephones, and removable memory modules.

Single level memory cells (SLC) can store a single bit of data. Multi-level memory cells (MLC) can store two or more bits of data.

One problem that can occur with programming MLC memory is floating gate-to-floating gate capacitive coupling. The coupling can result in one memory cell disturbing adjacent memory cells, thus causing erroneous data to be stored in the adjacent memory cells.

Multiple step programming algorithms have been used to reduce the floating gate-to-floating gate coupling while also improving threshold voltage distribution widths. One particular multiple step programming operation comprises a prior art touch-up programming operation. This type of programming comprises programming an even page of memory first, reading the even page of memory, programming an odd page of memory then "touching-up" the even page of memory with additional programming pulses. FIGS. 1A-1C illustrate plots of threshold voltage distributions that can result from using a typical prior art multiple step programming operation.

FIG. 1A illustrates threshold voltage distributions after an even page of memory has been programmed. This figure shows an erased state (111) as well as seven programmed states (000-011).

The states of FIG. 1A are each represented by three bits that are the programmed "hard" data of a multiple bit programmed word. The hard data are the actual data, of the multiple bit programmed word, that are used. The programmed word can also comprise "soft" data that are used to indicate a more precise location of the programmed state. For example, the area between each distribution that is indicated by the arrows is the soft data portion of the programmed word that indicates a location of its associated state to the right of the arrow. The soft data might be four bits of the multi-bit programmed word. Thus, the soft data can be considered the least significant bits (LSB) of the programmed word while the hard data can be considered the most significant bits (MSB) of the programmed word.

An even page read operation is performed after the even page has been programmed. Since programming of the memory pages might not be sequential, data stored in a page buffer for programming might be overwritten, after programming, by subsequent data to be programmed to the memory. Thus, during the even page read operation, the even page is read back out into the page buffer so that it can be further programmed during a subsequent touch-up programming operation, as discussed subsequently. This even page read can introduce errors into the programming operation, as subsequently described.

After the even page read is performed, the odd page of the memory cells is programmed. FIG. 1B illustrates the threshold voltage distributions after the odd page of memory has been programmed. The distributions have widened out due to the disturb effects of both program disturb (e.g., multiple programming voltages on the same word line) as well as floating gate-to-floating gate coupling.

It can be seen in FIG. 1B that the overlapping states have the potential to cause errors during reading of the memory since it could be unclear whether the read data belonged in, for example, the 001 state or the adjacent 101 state. In order to tighten up the distributions, an even page touch-up programming operation is performed.

The typical prior art even page touch-up programming operation comprises performing an additional program operation comprising additional programming pulses in order to program in the even page data read during the previous even page read operation. The even page touch-up programming operation programs the memory cells at the lower ends of the distributions to a high threshold voltage such that the memory cells at the lower ends of the distributions are moved up, thus tightening the distributions. FIG. 1C illustrates the distributions after the touch-up programming operation.

A problem with the above-described typical prior art multiple step programming operation is that, since the even page read operation does not use error correction coding, read errors are passed through uncorrected. This uncorrected data is then used during the touch-up programming operation. If the uncorrected data contains errors, the data is re-programmed with the errors during the touch-up operation. This can result in misplacement errors as shown in FIG. 1C by the "tails" 101-107 that are part of each distribution. These tails overlap with an adjacent distribution and represent the hard errors (e.g., error bits that are assigned a low probability of error by an error correction code (ECC) engine) transformed from the original soft errors (e.g., error bits that are assigned a high probability of error by the ECC engine) that can occur when assigning data to the wrong distribution during a read subsequent to the touch-up operation.

For the reasons stated above and for other reasons that will become apparent to those skilled in the art upon reading and understanding the present specification, there is a need in the art to reduce these programming errors caused by misplacement of data.

DETAILED DESCRIPTION

Figure 1A:
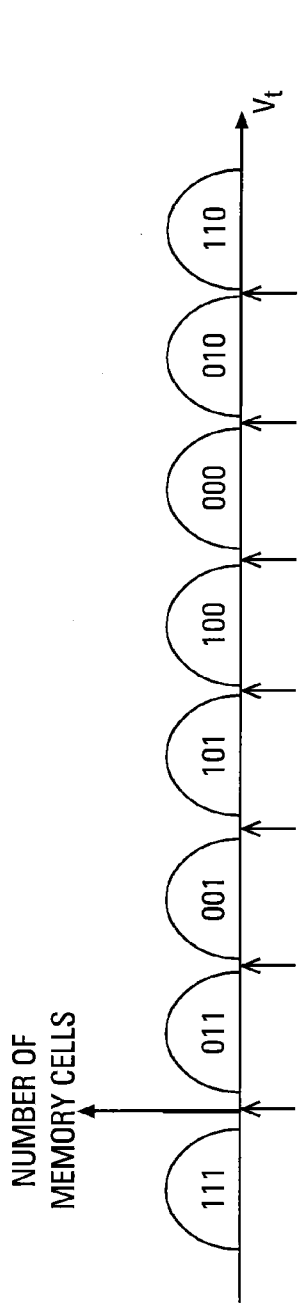
FIGS. 1A-1C show plots of threshold voltage distributions resulting from typical prior art multiple step programming
Figure 1B:
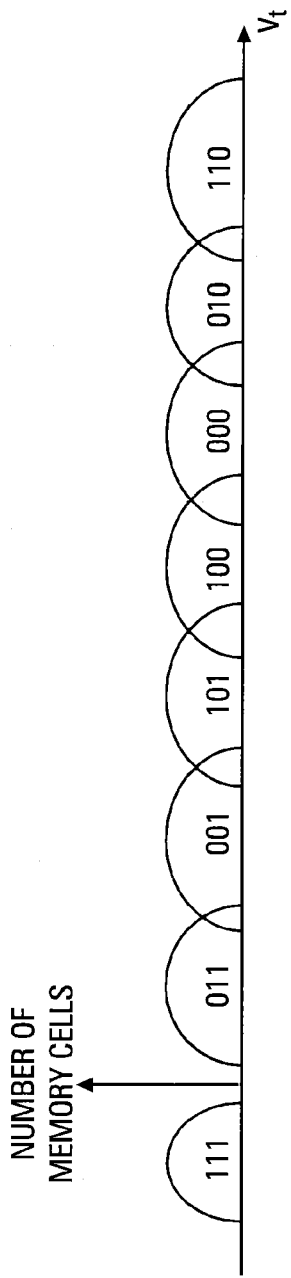
Figure 1C:
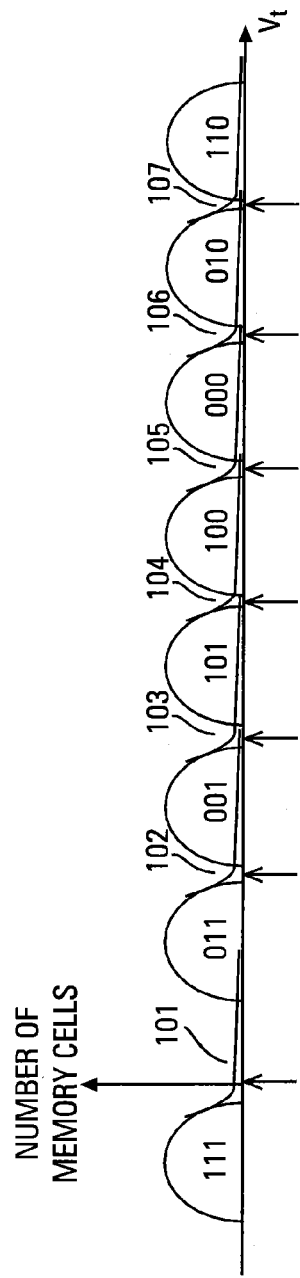

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
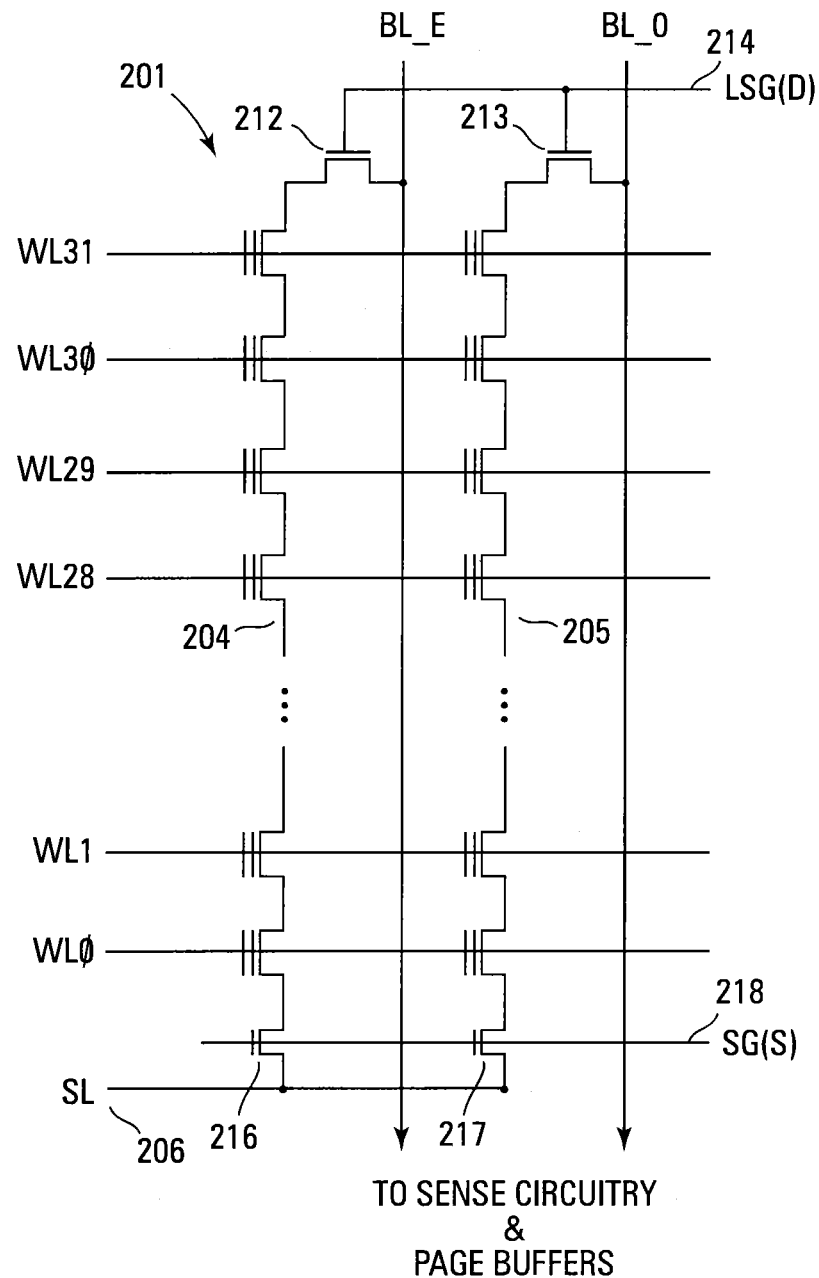
FIG. 2 shows a schematic diagram of one embodiment of a portion of a memory array.

FIG. 2 illustrates a schematic diagram of one embodiment of a portion of a NAND architecture memory array 201 comprising series strings of non-volatile memory cells. The present embodiments of the memory array are not limited to the illustrated NAND architecture. Alternate embodiments can use NOR, AND, PCM, or other architectures.

The memory array 201 comprises an array of non-volatile memory cells (e.g., floating gate) arranged in columns such as series strings 204, 205. Each of the cells is coupled drain to source in each series string 204, 205. An access line (e.g., word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detects the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

In a typical prior art programming of the memory array, each memory cell is individually programmed as either a single level cell (SLC) or a multiple level cell (MLC). The prior art uses a cell's threshold voltage ($V_t$) as an indication of the data stored in the cell. For example, in an SLC, a $V_t$ of 2.5V might indicate a programmed cell (e.g., logical "0" state) while a $V_t$ of –0.5V might indicate an erased cell (e.g., logical "1" state). An MLC uses multiple $V_t$ ranges that each indicates a different state. Multiple level cells can take advantage of the analog nature of a traditional flash cell by assigning a specific bit pattern (e.g., 000-110) to a specific $V_t$ range.

Figure 3:
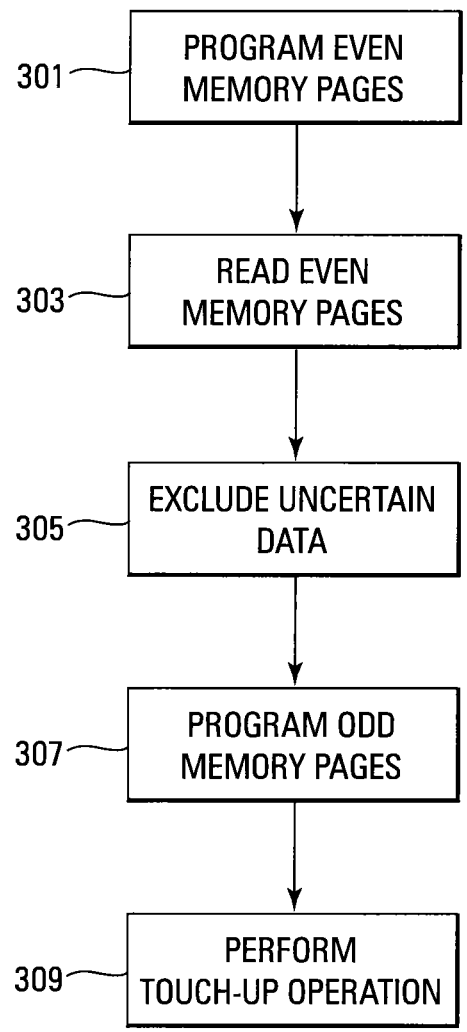
FIG. 3 shows a flow chart of one embodiment of a method for programming memory using a modified touch-up operation.

FIG. 3 illustrates a flow chart of one embodiment of a method for programming memory using a modified touch-up operation. The even page of a group of memory cells is programmed 301 from data in a page buffer. For example, the group of memory cells might comprise a block memory of memory cells.

The programming can be accomplished by a series of programming pulses applied to a word line coupled to control gates of the memory cells being programmed. A program verify operation after each programming pulse determines whether the memory cell has been programmed to its desired threshold voltage as dictated by the respective data to be programmed. When the memory cell turns on in response to a read voltage on the respective word line and produces a current or voltage on a respective bit line, as detected by the sense circuitry, the memory cell has been programmed.

Figure 4:
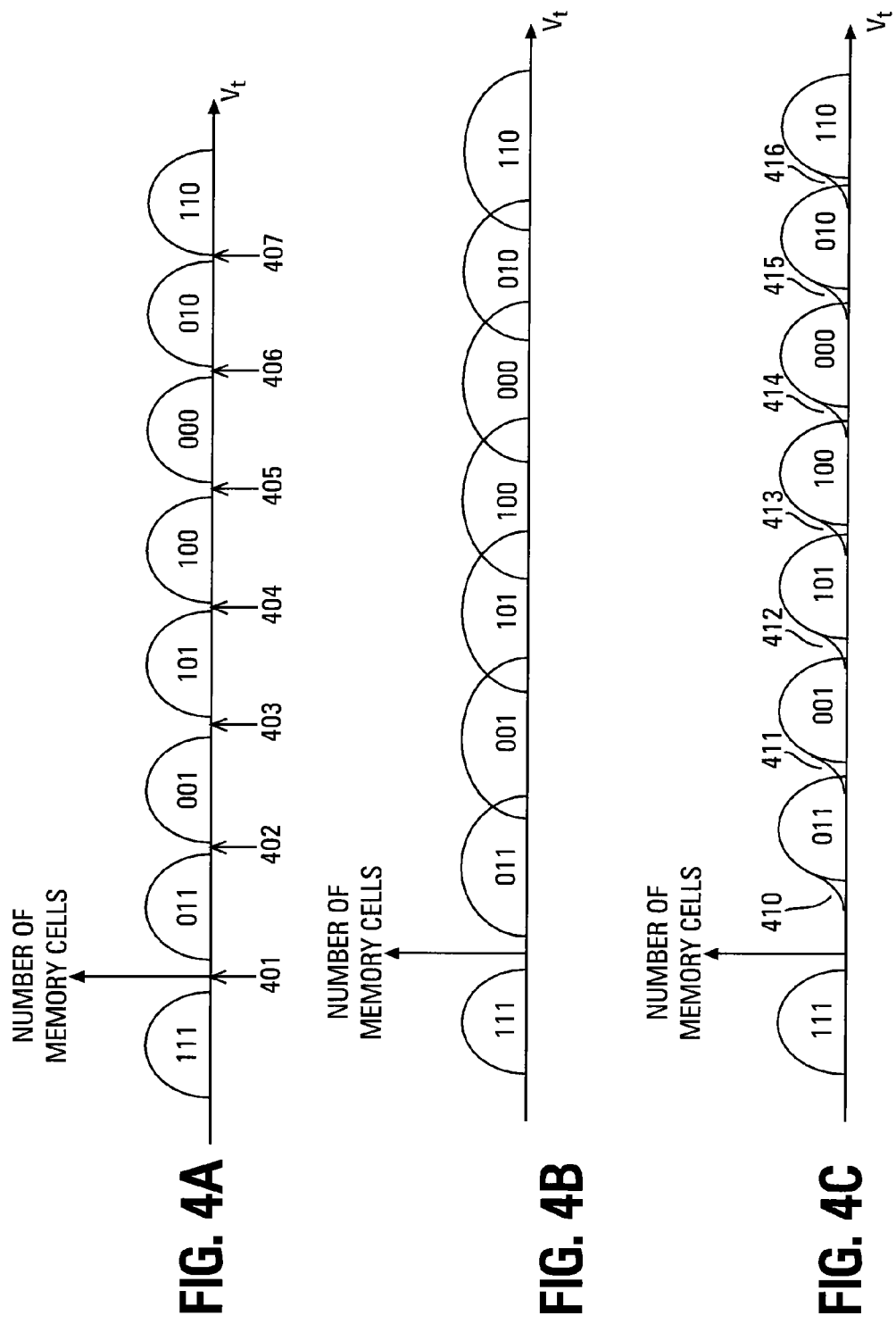
FIGS. 4A-4C show plots of threshold voltage distributions in accordance with the method for programming of FIG. 3.

FIG. 4A illustrates the threshold voltage distributions that can result from the even page programming. The x-axis of the plot is the threshold voltage $V_t$ and the y-axis is the number of memory cells at each threshold voltage. The distributions are the result of the fact that memory cells program at different rates. Thus, one programming pulse might move a first memory cell to the middle of the "011" state while another memory cell might only move to the left side of the "011" state after the same programming pulse.

While a large number of the memory cells end up being programmed to within the distributions, some of the memory cells end up in uncertain areas 401-407. When this uncertain data is read, ECC correction is not used when it is later re-programmed. For example, if uncertain data is read from the uncertain area 403 between the threshold voltage distributions for states "001" and "101", they can be either one of the states, thus possibly resulting in the previously described misplacement errors if the data is read and later programmed as the wrong state.

Since the memory pages are not always programmed sequentially, the programmed even page or pages are read back out 303 to the page buffer. As subsequently described, this data is used later during a touch-up operation. During the reading of the page of data subsequent to the touch-up operation, an ECC engine checks the data for errors and attempts to perform corrections on the errors.

In order to reduce the hard errors caused by the touch-up operation passing through the read data "as-is" without ECC correction, the uncertain data is excluded, inhibited, or removed from the page buffer 305. Thus, the uncertain data is left in the uncertain areas 401-407 between the distributions and are not further programmed during the subsequent touch-up operation.

The odd memory page or pages are then programmed 307. This can be accomplished in a substantially similar manner to the even page or pages programming in that the data are programmed to their respective memory cells from the page buffer by increasing the threshold voltages of the respective memory cells to the respective threshold voltage of each desired state.

FIG. 4B illustrates the threshold voltage distributions after the odd page or pages being programmed. It can be seen that the disturb caused by the additional programming and floating gate-to-floating gate coupling of the memory cells has widened the distributions such that they overlap. In order to tighten up the distributions, a touch-up programming operation is performed 309.

The touch-up programming operation comprises programming the data from the page buffer, that was previously read from the even page or pages, back to the memory cells. In one embodiment, the data is programmed back a certain voltage (e.g., 400 mV) higher. This has the effect of moving the lower ends of the distributions to higher threshold voltages and tightening the distributions.

The uncertain data from the uncertain locations 401-407 of FIG. 4A were not moved thus resulting in "tails" 410-416 on the distributions representing the uncertain data. However, these uncertain data are now "soft" errors (e.g., the least significant bits) instead of the "hard" errors (e.g., most significant bits) that resulted from the prior art touch-up programming operation.

The previous description, for purposes of illustration, started with programming the even page of data prior to programming the odd page of data. An alternate embodiment can comprise programming the odd page first, reading the odd page, programming the even page, then reprogramming the odd page.

Figure 5:
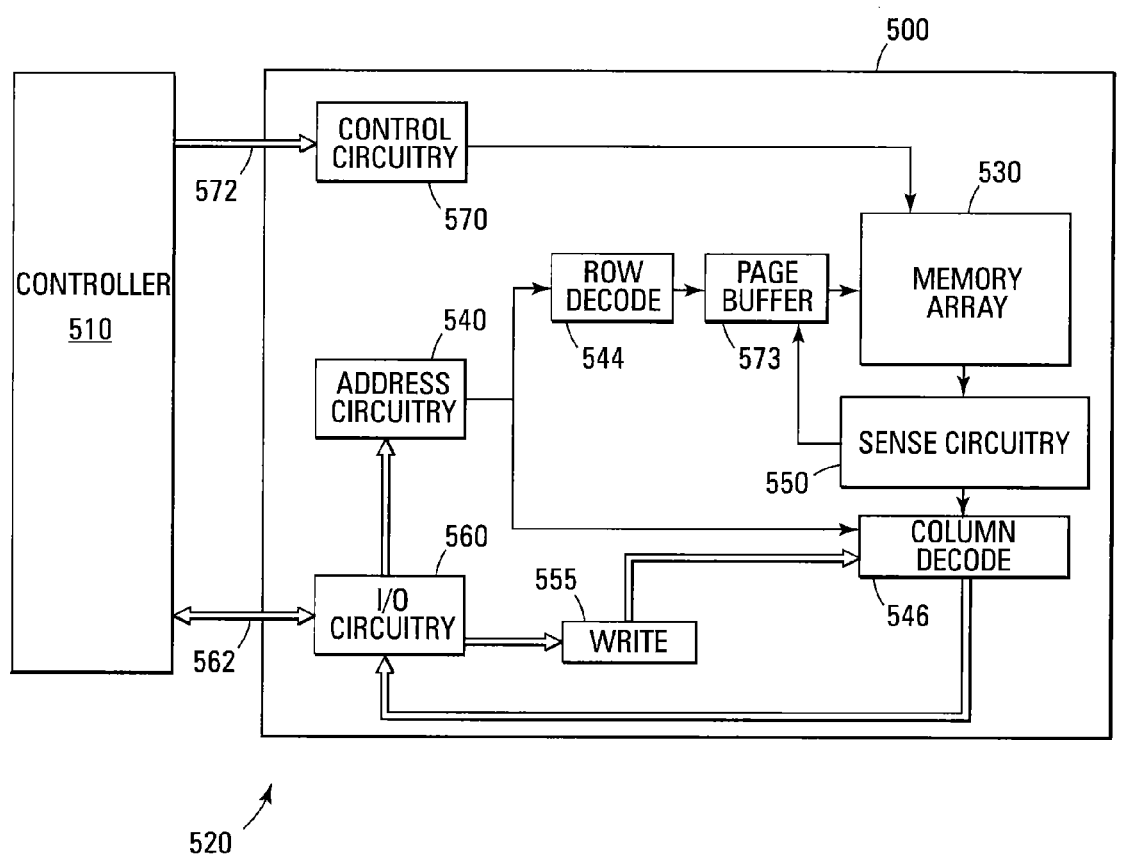
FIG. 5 shows a block diagram of one embodiment of a system that can incorporate the multiple step programming method using the modified touch-up operation.

FIG. 5 illustrates a functional block diagram of a memory device 500 as part of a memory system 520. The memory device 500 is coupled to a controller 510. The controller 510 may be a microprocessor or some other type of controlling circuitry. The memory device 500 has been simplified to focus on features of the memory that are helpful in understanding the present invention.

The memory device 500 includes an array 530 of non-volatile memory cells, such as the one illustrated previously in FIG. 2. The memory array 530 is arranged in banks of word line rows and bit line columns. In one embodiment, the columns of the memory array 530 are comprised of series strings of memory cells as illustrated in FIG. 2. As is well known in the art, the connections of the cells to the bit lines determines whether the array is a NAND architecture, an AND architecture, a NOR architecture, or another architecture.

Address buffer circuitry 540 is provided to latch address signals received through I/O circuitry 560. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts. The page buffer 573, as previously described, is coupled to the memory array for storing data to be programmed or that has been read.

The memory device 500 reads data in the memory array 530 by sensing voltage or current changes in the memory array columns using sense circuitry 550. The sense circuitry 550, in one embodiment, is coupled to read and latch a row of data from the memory array 530. The I/O circuitry 560 provides bidirectional data communication as well as address communication over a plurality of data connections 562 with the controller 510. Write circuitry 555 is provided to write data to the memory array.

Memory control circuitry 570 decodes signals provided on control connections 572 from the controller 510. These signals are used to control the operations on the memory array 530, including data read, data write (program), and erase operations. The memory control circuitry 570 may be a state machine, a sequencer, or some other type of control circuitry to generate the memory control signals. In one embodiment, the memory control circuitry 570 is configured to execute the method for programming with the modified touch-up programming operation.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, one or more embodiments include an improved multiple step programming method that reduces the chances of "hard" errors caused by an ECC engine assigning uncertain data to the wrong state. This can be accomplished by excluding the uncertain data from reprogramming during the touch-up operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for multiple step programming in a memory device, the method comprising:
   programming data to a page of memory cells wherein the programmed data corresponds to a plurality of threshold voltage distributions;
   reading data from the page of memory cells; and
   reprogramming the page of memory cells with the read data wherein data having a threshold voltage within threshold voltage ranges between the plurality of threshold voltage distributions is not reprogrammed.

2. The method of claim 1 wherein the page of memory cells is part of a block of memory cells.

3. The method of claim 1 wherein the data comprises a first page of data and further comprising programming a second page of data to a second page of memory cells after programming the first page of data.

4. The method of claim 3 wherein the first page of data is an even page of data and the second page of data is an odd page of data.

5. The method of claim 1 and further comprising excluding the data having a threshold voltage within threshold voltage ranges between the plurality of threshold voltage distributions from the read data prior to reprogramming the page of memory cells.

6. The method of claim 1 wherein reading the data from the page of memory cells comprises reading the data to a page buffer and further comprising:
   excluding the data having a threshold voltage within threshold voltage ranges between the plurality of threshold voltage distributions from the page buffer prior to reprogramming the page of memory cells.

7. The method of claim 1 wherein read data is not corrected prior to reprogramming.

8. A method for multiple step programming in a memory device, the method comprising:
   programming data to a group of memory cells;
   reading data from the group of memory cells wherein the read data comprises data having a threshold voltage between logical states of programming; and
   reprogramming the group of memory cells with the read data without reprogramming memory cells of the group from which the data having a threshold voltage between logical states of programming was read.

9. The method of claim 8 wherein the group of memory cells is a page of memory cells.

10. The method of claim 8 wherein programming the data to the group of memory cells comprises programming an even page of data.

11. The method of claim 10 and further comprising programming an odd page of data to the group of memory cells after reading the data from the group of memory cells.

12. The method of claim 8 wherein programming the data to the group of memory cells comprises programming multiple bit data to the group of memory cells.

13. A memory device comprising:
   an array of memory cells; and
   memory control circuitry configured to control programming of the array of memory cells wherein the memory control circuitry is configured to cause a page of data to be programmed to a group of memory cells, read a page of data from the group of memory cells, and reprogram the page of read data to the group of memory cells without reprogramming data from the read page of data having a threshold voltage within threshold voltage ranges between a plurality of threshold voltage distributions.

14. The memory device of claim 13 wherein the group of memory cells is an even page of memory cells and the memory control circuitry is further configured to cause a page of data to be programmed to an odd page of memory cells prior to the page of data to the even page of memory cells being reprogrammed.

15. The memory device of claim 13 wherein the array of memory cells comprise one of a NAND, a NOR, or an AND architecture of flash memory cells.

16. The memory device of claim 13 wherein the data not being reprogrammed comprises data that is between logical programming states.

17. A system comprising:
a controller configured to generate memory control signals; and
a memory device coupled to the controller and configured to operate in response to the memory control signals, the memory device comprising:
an array of memory cells; and
memory control circuitry configured to cause programming of the array of memory cells wherein the memory control circuitry is configured to cause: data to be programmed to a page of memory cells, data to be read from the programmed page of memory cells such that the read data comprises data between logical states, and the read data to be reprogrammed, without the data between the logical states, to the page of memory cells.

18. The system of claim 17 wherein the memory control circuitry is further configured to cause generation of programming pulses to the memory cells during the programming and reprogramming of the page of memory cells.

19. The system of claim 18 wherein the memory control circuitry is further configured to cause a verify operation between each of the programming pulses.

20. The system of claim 17 wherein the memory device further comprises a buffer and the memory control circuitry is further configured to cause the read data to be stored in the buffer and exclude the data that is between logical states prior to reprogramming of the read data.

* * * * *